United States Patent [19]
Mohr

[11] 4,079,315
[45] Mar. 14, 1978

[54] METHOD AND APPARATUS FOR MEASURING TIME INTERVAL BETWEEN TWO PULSE SIGNALS

[75] Inventor: Walter Mohr, Bruggen, Erft, Germany

[73] Assignee: Krautkramer-Branson, Incorporated, Stratford, Conn.

[21] Appl. No.: 735,588

[22] Filed: Oct. 26, 1976

[30] Foreign Application Priority Data

Feb. 23, 1976 Germany ............................ 2607187

[51] Int. Cl.² .............................................. G04F 8/00
[52] U.S. Cl. ..................................... 324/186; 324/187; 328/129; 235/92 T
[58] Field of Search ............... 324/186, 166, 187, 787, 324/99 D, 78 D, 79 D; 235/92 T; 328/129, 130

[56] References Cited

U.S. PATENT DOCUMENTS

| | | | |
|---|---|---|---|
| 3,713,136 | 1/1973 | Nagy, Jr. ............................ | 324/99 D |
| 3,728,626 | 4/1973 | Douglas et al. .................... | 324/99 D |
| 3,731,194 | 5/1973 | Favin .................................. | 324/186 |
| 3,983,481 | 9/1976 | Nutt et al. .......................... | 324/186 |

*Primary Examiner*—M. Tokar
*Attorney, Agent, or Firm*—Ervin B. Steinberg; Philip J. Feig

[57] ABSTRACT

The time interval between two consecutive pulse signals, as occurring for instance in nondestructive ultrasonic pulse-echo testing, is measured by measuring with a counting frequency the width of the interval start pulse signal and the width of the interval stop pulse signal at respective base lines, and the time interval between both stated signals. Using either two different counting frequencies having a ratio of two to one, or utilizing summing and dividing means the time interval between the start and the stop pulse signals is determined with negligible error.

11 Claims, 6 Drawing Figures

METHOD AND APPARATUS FOR MEASURING TIME INTERVAL BETWEEN TWO PULSE SIGNALS

BRIEF DESCRIPTION OF THE INVENTION

This invention concerns a method for measuring the time related distance between two consecutive pulse signals, particularly for determining the transit times of acoustic signals. In non-destructive testing of materials by ultrasonic energy, acoustic pulse signals are transformed into electrical pulse signals which then are utilized for determining the transit times of sound, for establishing values of sound velocity, workpiece length or workpiece thickness.

At the present state of the art, the time related distance between two pulse signals is determined by measuring the time interval between a point on the ascending slope of the initial pulse signal and the corresponding point on the ascending slope of the succeeding pulse signal (points of the same phase angle). Such a measurement is precise only if the corresponding points on the ascending slopes are disposed at the absolute zero base line of the pulses. Since these points are not determinable on account of noise, spurious oscillations or other effects, base line points are produced by establishing a threshold value and measuring the corresponding time responsive distance between the arbitrarily established base points at the threshold level. However, in the latter case, the measurement is severely influenced by the pulse wave shape, that is, the interval measured is affected by the steepness of the ascending slope of the pulse signal. This disadvantage can be reduced to a constant error by maintaining the peak amplitudes of the signals constant and processing the constant error electronically during signal evaluation. Maintaining a constant amplitude signal is possible only by control means and, as is well understood, all control means have a finite time constant, thus making it impossible to compensate for rapidly occurring changes of the signal.

The present invention concerns an arrangement of eliminating errors in time interval measurements as noted heretofore.

In accordance with the present invention it is disclosed to utilize a first count frequency for the time interval between the interval start pulse signal and the interval stop pulse signal, both signals being associated with an adjustable threshold value, and a second and different count frequency for the interval between the end of the base of the start pulse signal and the start of the base of the stop pulse signal. The count frequencies preferably are selected in the ratio of one to two. By means of an addition in a counter the time related distance of both pulse signals is then indicated as a precise digital value.

The count frequency can be selected also to cause either the transit time (e.g. in units of nanoseconds) or the transit distance (workpiece thickness) to be available in digital form as a multiple of a suitable measurement unit (e.g. 0.1 mm).

A transit time measurement of this type is necessary for measuring the wall thickness or length of workpieces with ultrasonic energy in such cases where compressional wave energy is conducted by the workpiece in a satisfactory manner.

Embodiments of the present invention are explained in greater detail in the following description which is to be read in conjunction with the accompanying drawings.

DETAILED DESCRIPTION OF THE INVENTION

Figure 1:
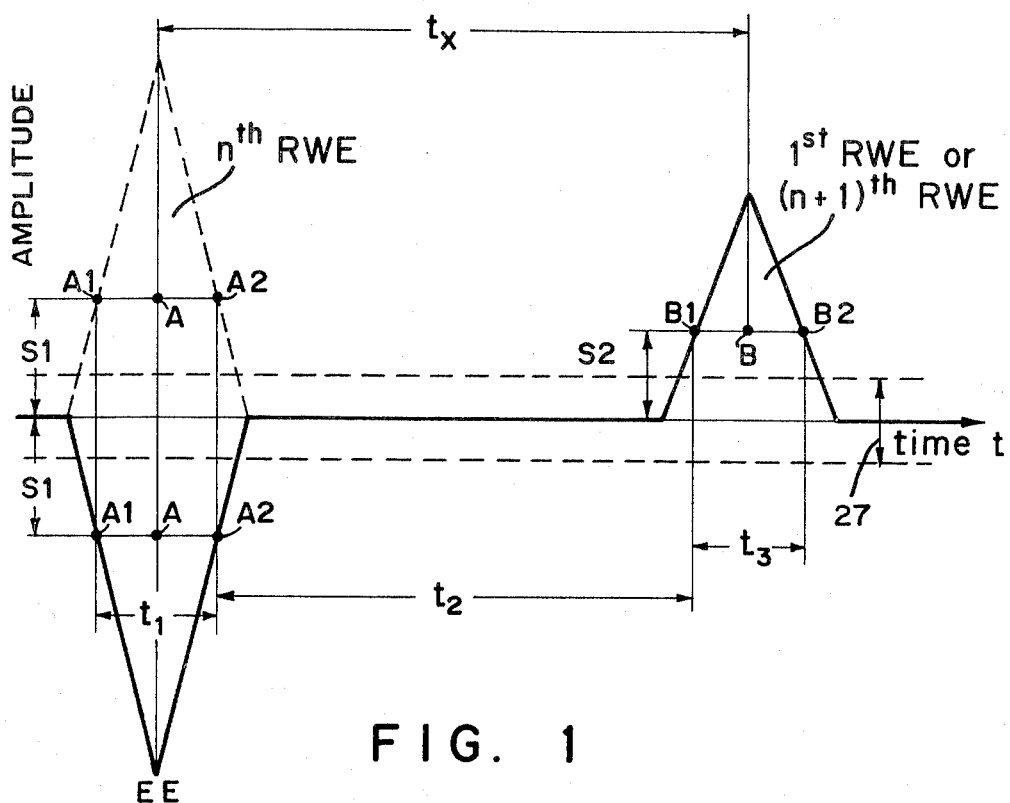
FIG. 1 is a pulse-time diagram of symmetric pulse signals.

Referring to the figures, and FIG. 1 in particular, it is apparent that the trigger pulse EE must exceed the predetermined adjustable threshold value S1 and that the ensuing pulse, the distance of which to the trigger pulse is to be measured, must exceed the adjustable threshold value S2. The value to be measured is the time related distance between the points A and B, that is, the time interval $t_x$. In accordance with this invention the time interval $t_x$ is determined by measuring first the base A1 to A2, which is the time interval $t_1$, then the distance A2 to B1, which is the time interval $t_2$, and finally the base B1 to B2, which is the time interval $t_3$.

The term "base" is used here and in the following text for the pulse width at the threshold amplitude value.

From FIG. 1 it is apparent that the desired time interval $t_x$ can be calculated as follows:

$$t_x = \frac{t_1}{2} + t_2 + \frac{t_3}{2} \qquad \text{(equ. 1)}$$

or $$t_x = \tfrac{1}{2}(t_1 + t_3) + t_2 \qquad \text{(equ. 2)}$$

or $$t_x = \frac{(t_1 + t_2) + (t_2 + t_3)}{2} \qquad \text{(equ. 3)}$$
$$= \tfrac{1}{2}(t_1 + 2t_2 + t_3)$$

These three equations lend themselves to three measuring methods.

First. The time intervals $t_1$ and $t_3$ are counted with a frequency $f_o/2$ and the time interval $t_2$ is counted with frequency $f_o$. The addition of the three time intervals results in the time $t_x$.

Second. The three time intervals are counted with the same frequency $f_o$ whereby the time intervals $t_1$ and $t_3$ are measured with a first counter, and the time interval $t_2$ with a second counter. The first counter is programmed to determine the value of $\tfrac{1}{2}(t_1 + t_3)$ and the second counter to determine the value of $t_2$.

Third. The time intervals $t_1$ and $t_2$ are counted with frequency $f_o$ in a first counter, and the time intervals $t_2$ and $t_3$ are counted with the same frequency $f_o$ in a second counter. The counts accumulated in the first counter and the counts accumulated in the second counter are summed and this latter sum is then divided by a factor of two.

With these concepts in mind, it is possible to measure transit times of pulse signals of the same polarity, for instance, the interval between two consecutive rear wall echo signals (multiple echo signals), shown herein with broken lines the nth rear wall echo signal (RWE) instead of the entrant surface echo (EE) and the (n + 1) RWE signal instead of the first transmit pulse responsive RWE signal.

Utilizing the present invention most advantageously, the transit time measured is entirely independent of pulse width. Therefore, the threshold value of the initial pulse signal and that of the following signal can be set for different amplitudes. In every case in which the pulse signal amplitude exceeds that of the noise signal it is possible to suppress the noise signal.

A further advantage of the technique is the absence of the requirement for a control means which inherently has a finite time constant.

Figure 2:
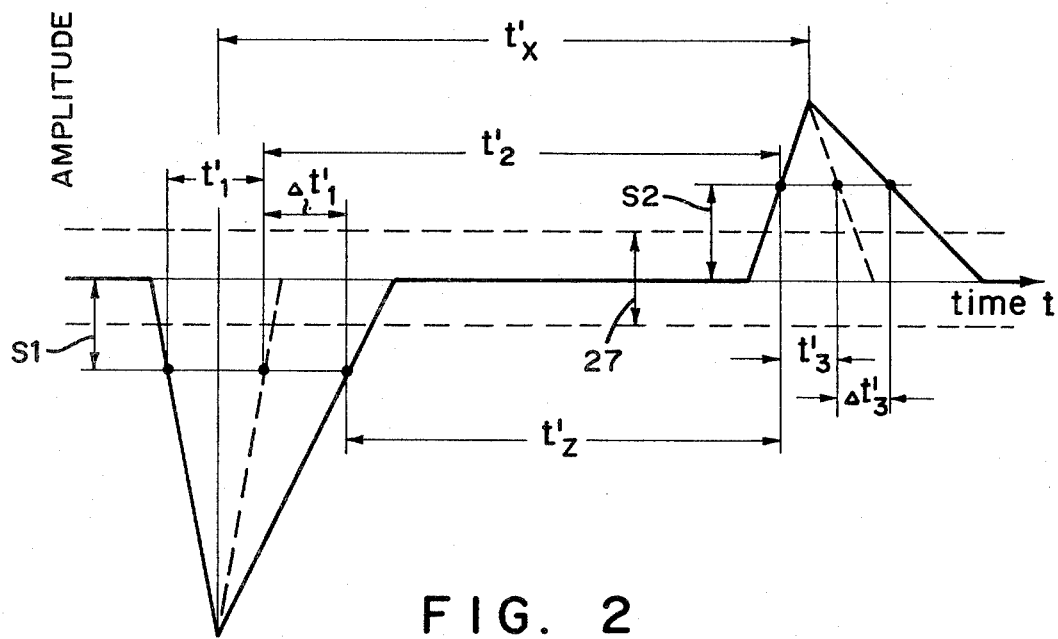
FIG. 2 is a pulse-time diagram of non-symmetric pulse signals.

Assuming that a small residual error is acceptable, the present transit time measurement method can be used also for non-symmetrical pulse signals, a condition frequently present in practice. It is merely a prerequisite that the shape of the first pulse signal and that of the ensuing pulse signal be similar as shown in FIG. 2. From measurement the following value is derived.

$$\frac{t_1' + \Delta t_1'}{2} + t_2' + \frac{t_3' + \Delta t_3'}{2}$$

$$t_2' = t_2' - \Delta t_1'$$

$$\tfrac{1}{2}t_1' + t_2' + \tfrac{1}{2}t_3' + \tfrac{1}{2}(\Delta t_3' - \Delta t_1')$$

$$t_x' = \tfrac{1}{2}t_1' + t_2' + \tfrac{1}{2}t_3'$$

A comparison of the measured value with respect to the nominal value reveals an error of:

$$\tfrac{1}{2}(\Delta t_3' - \Delta t_1').$$

The transit time measured, therefore, is in error by this insignificantly small value which in practice can be neglected.

Figure 3:
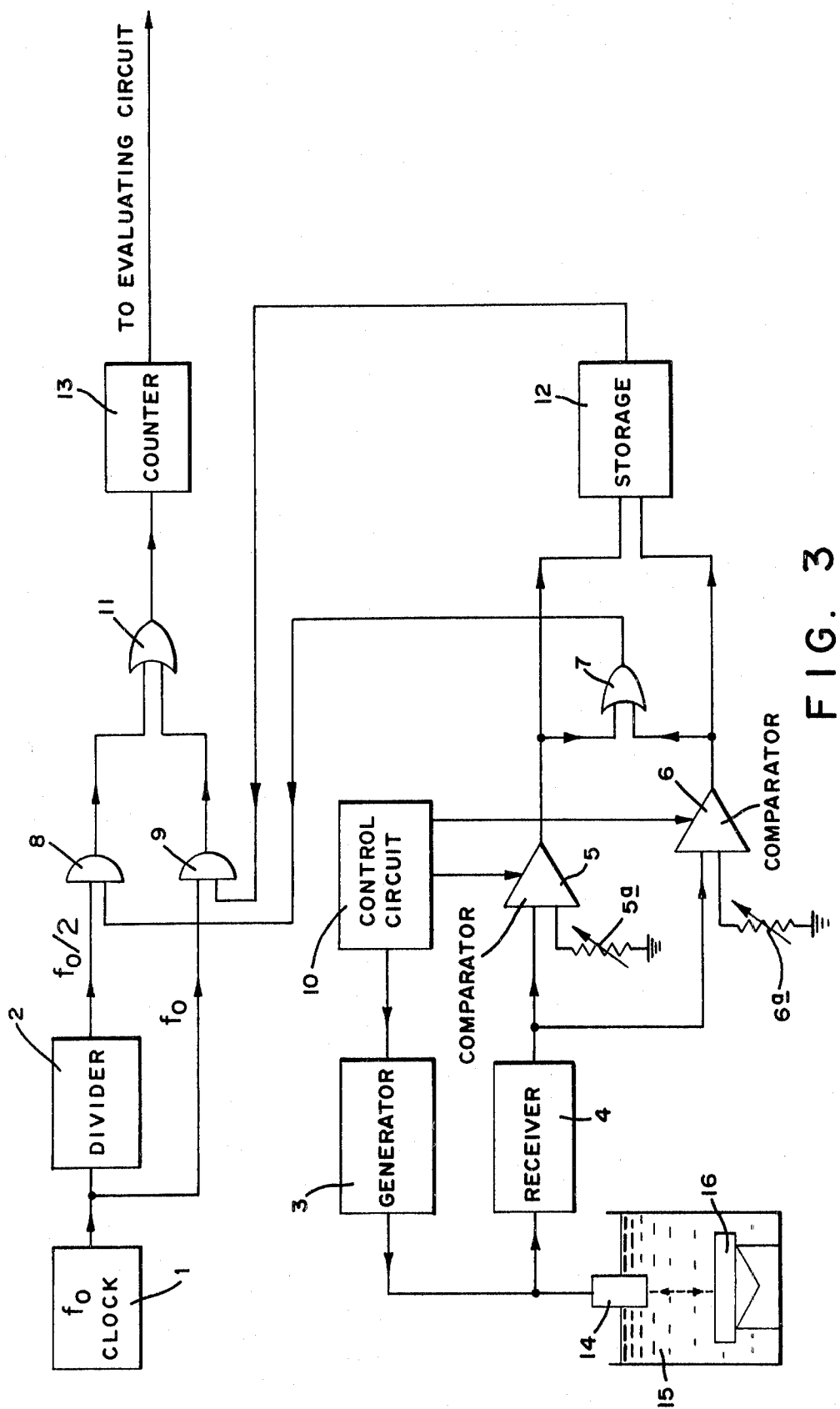
FIG. 3 is a schematic electrical block diagram of a measuring circuit in accordance with the present invention.

Using the circuit shown in FIG. 3, the present invention will now be described in connection with the first measuring method.

The frequency count signal having a frequency $f_o$ is provided by a clock generator 1, operating for instance at 30 MHz. A frequency divider circuit 2 divides the frequency from the clock generator by a value of two to provide $f_o/2$ or 15 MHz. Hence both count frequencies, $f_o$ and $\tfrac{1}{2}f_o$, are available at one input of the respective AND gates 8 and 9.

Figure 4:
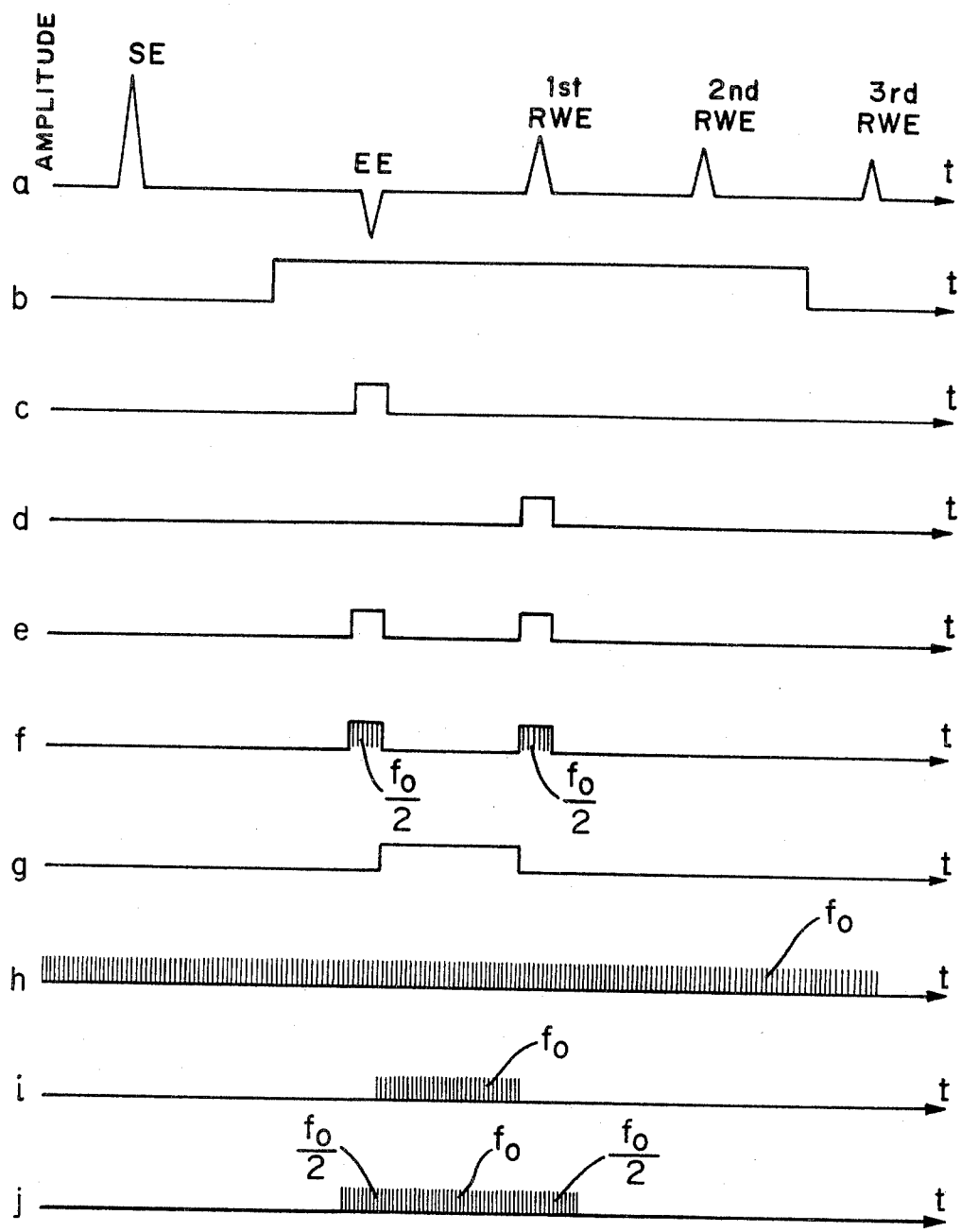
FIG. 4 is a pulse-time diagram related to the block diagram per FIG. 3.

The ultrasonic test circuit comprising a pulse generator 3, a receiver 4, ultrasonic probe 14, a workpiece 16 and a water delay path 15 provides echo signals in accordance with trace a of FIG. 4. The following designations apply.

SE is the transmit pulse signal from the pulse generator 3 to the transducer probe; EE is the entrant surface echo caused by the transmit pulse signal entering the workpiece 16, such signal being received as an entrant surface echo by the transducer probe 14 and is amplified in the receiver circuit 4; 1st RWE is the first rear wall echo; 2nd RWE is the second rear wall echo; and 3rd RWE is the third rear wall echo. The subsequent rear wall echoes as well as the multiple echo signals arising from acoustic signal reflection at the workpiece entrant surface are not indicated.

The generator 3 is triggered by signals from the control logic circuit 10. The control logic circuit 10 initiates also the gates for two comparators 5 and 6 which are operative only during the gate interval, see curve b of FIG. 4. The gates can be adjusted in such a manner that only the entrant surface echo signal and the rear wall echo signal are used for evaluation. However, the gates can be adjusted also to be open only after the occurrence of the entrant surface echo signal to cause the first rear wall signal and the succeeding rear wall echo signals to be used for evaluation.

The gate is closed prior to the next transmit pulse signal from the generator 3. Most suitably, of course, the time span during which the gate is open is adjusted for the interval during which the pulse signals to be measured are expected to occur. The transmit pulse signal, that is the pulse signal which is to start the time interval measurement, is processed in one of the two comparators 5 or 6, in the present example comparator 5, trace c. Both comparators are operated sequentially and inhibited against the passing of additional pulse signals, but are rendered operative for receiving a further set of signals responsive to renewed opening of the gate caused by the triggering of the control logic circuit 10. The second pulse signal, i.e. the stop interval measurement signal, is processed by the other comparator, in the present example by comparator 6, curve d.

The threshold values of the comparators are set by means of voltage bias means 5a and 6a. The output signals from both comparators are coupled to the OR gate 7 (trace e). The pulse signals from OR gate 7 are coupled via the AND gate 8 to the count frequency $f_o/2$ (trace f). This signal (trace f) is applied to the input of the OR gate 11. Both signals from the comparators 5 and 6 (trace c and trace d) are applied also to a storage means 12. This storage means 12 is set by the descending slope of the signal from comparator 5 and zeroized by the ascending slope of the signal from comparator 6. The pulse signal diagram (trace g) shows the condition of the storage means 12. The signal from the storage means 12 (trace g) is coupled via gate 9 to the signal from the clock 1, trace h, i.e. the count frequency $f_o$.

Therefore, the input of the gate 11 receives the signal as shown by trace f and the signal as shown by trace i. The gate 11 causes both signals to be coupled in an OR circuit, therefore, counter 13 receives a signal as shown by trace j, FIG. 4. This latter signal is formed by the time interval $t_1$ (counted at the frequency $f_o/2$), the time interval $t_2$ (counted at the frequency $f_o$), and the time interval $t_3$ (counted at the frequency $f_o/2$). In this manner the counter 13 provides the value for the time interval $t_x$ to be determined.

In view of the fact that the first and the second rear wall echo signals can be evaluated more distinctly it is desired often to measure the time related distance between such echo signals and not the distance between the entrant surface echo and the first rear wall echo signal. To accomplish this, it is necessary only to adjust the gate for the signal shown by trace b. Such an adjustment is sensible only if the second rear wall echo signal is sufficiently distinct over the noise level 27. It is possible also to provide a third comparator and adjust the counter in such a manner that either the distance from the entrant surface echo signal to the first rear wall echo signal, or the distance from the first rear wall echo signal to the second rear wall echo signal is timed by clock counts. In this way it is possible to provide a circuit suited for the respective prevailing signal conditions. Moreover, if for the sake of assurance both distances, or time intervals, are to be measured, a second counter is required.

Figure 5:
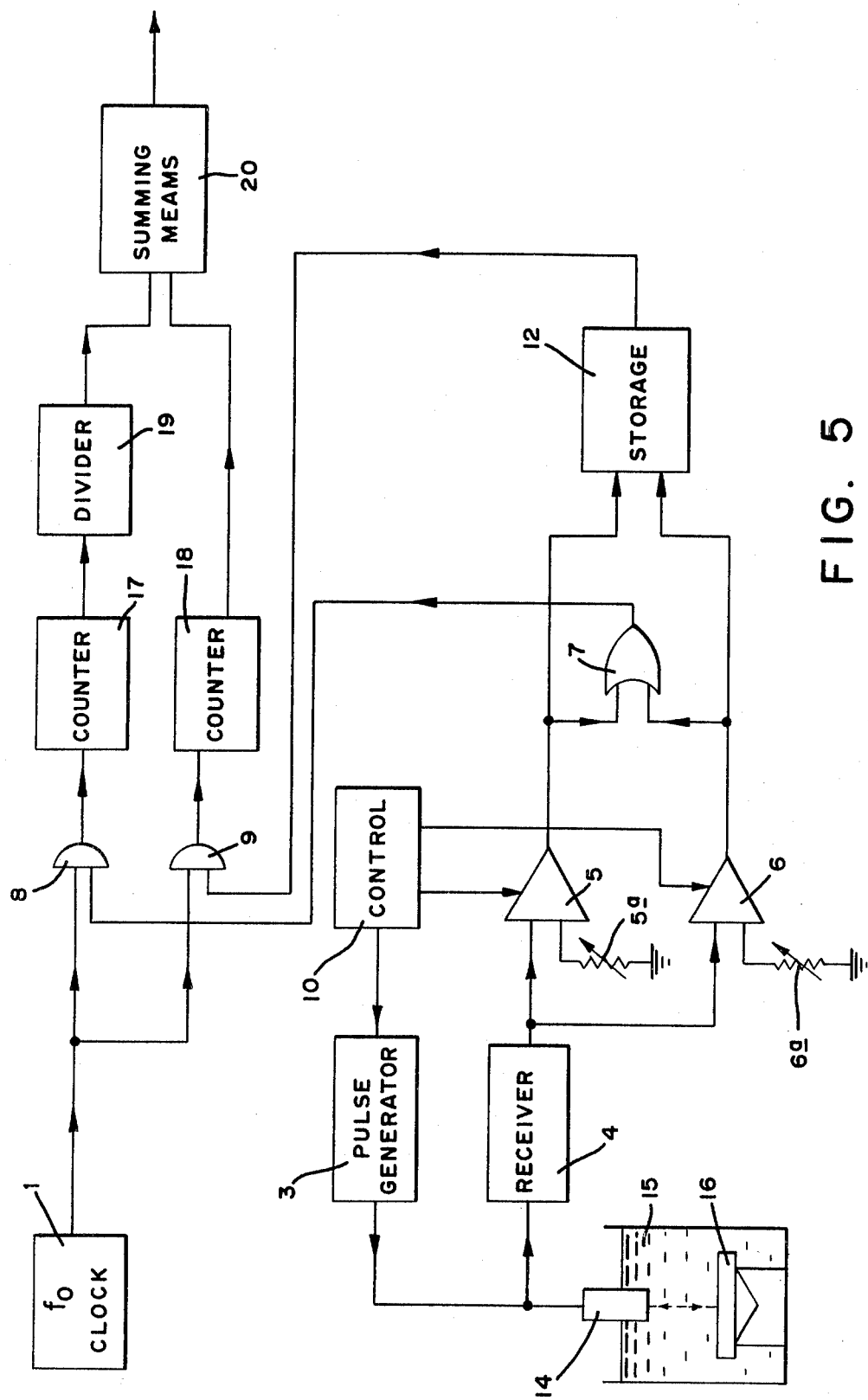
FIG. 5 is a schematic electrical block diagram of an alternative embodiment of the measuring circuit.

In the circuit embodiment in accordance with the second measuring method only a single count frequency is required, which frequency is fed from the clock 1 to the AND gate circuits 8 and 9, see FIG. 5. The count pulses are fed to the counter 17 during the base time of both pulse signals of the measuring process as timed by the comparators 5 and 6, the latter providing via the OR gate 7 the corresponding signal to the AND gate 8. In this manner, the value of $t_1$ plus $t_3$ is derived, and in the following divider circuit 19 the value is divided by a factor of two to produce $\frac{1}{2}(t_1 + t_3)$. The interval $t_2$ between the signal bases, as described in connection with the first embodiment, is measured in the counter 18 using the counting frequency $f_o$. The summing means 20 thereafter provides the value:

$$t_x = \tfrac{1}{2}(t_1 + t_3) + t_2$$

Figure 6:
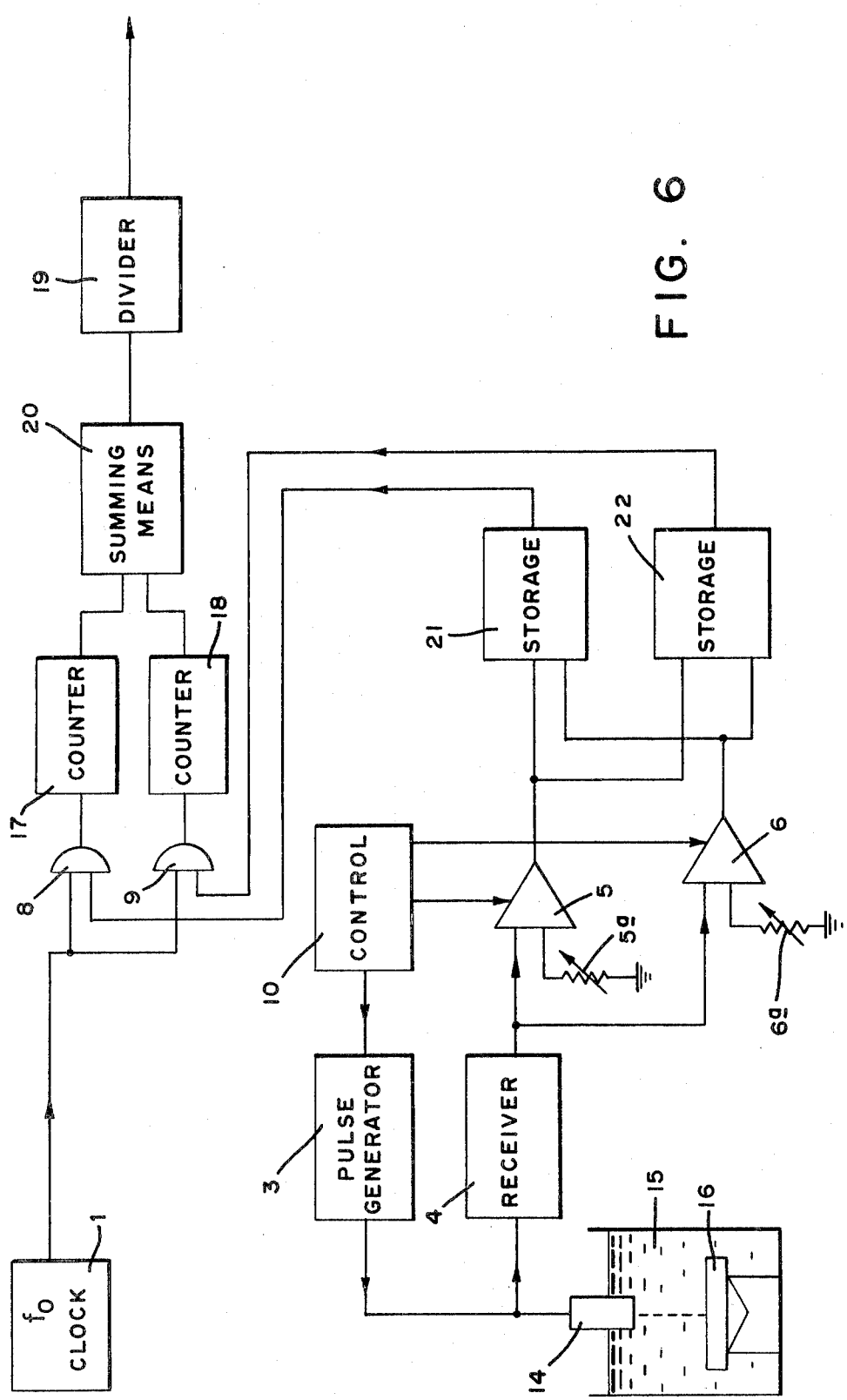
FIG. 6 is a schematic electrical block diagram of still another embodiment of the measuring circuit.

The third measuring method is illustrated in FIG. 6. This method also utilizes only a single count frequency $f_o$ which is applied to one input of both AND gates 8 and 9. A signal from the comparator 5 corresponding to the base point A1 of the ascending slope of the interval start signal sets the storage means 21 and a subsequent signal from the comparator corresponding to the base point B1 of the ascending slope of the subsequent pulse signal resets the storage means. In this manner, the counter 17 is fed with the count pulses occurring during the time intervals $t_1$ and $t_2$, FIG. 1. The storage means 22 is set by the base point A2 of the descending slope of the interval start signal and is reset by the base point B2 of the descending slope of the following pulse signal. In this manner the counter 18 is provided with the count pulses via the AND gate 9 during the time intervals $t_2$ and $t_3$. The counts from both counters are added in the summing means 20 and divided by a factor of two in the dividing means 19 to produce the value:

$$t_x = \tfrac{1}{2}(t_1 + 2t_2 + t_3).$$

The above described methods and arrangements are not limited for use in conjunction with ultrasonic testing, but are equally applicable for determining by digital measurement the time intervals between successive electrical signals without regard to the polarity of such pulses provided their shape is symmetric or nearly symmetric.

For the sake of simplicity, cyclic zeroizing of the storage means and of the counters, as is necessary for periodically occurring successive pulse signals, has been omitted since this feature is well understood in the art. Zeroizing is suitably accomplished by a signal from the circuit 10 at the time the pulse generator 3 is triggered.

What is claimed is:

1. The method for measuring the time interval between two time spaced approximately symmetrical pulse signals of identical or of opposite polarity, one of said signals defining the interval start pulse signal and the other the interval stop pulse signal, comprising the steps of:

applying a respective direct current threshold signal to said pulse signals to define a base line for each of said pulse signals;

measuring with a first counting frequency the time related base line length of the interval start pulse signal and that of the interval stop pulse signal;

measuring with a second and different counting frequency the time interval between the end of the start pulse signal taken at its base line and the start of the stop pulse signal taken at its respective base line, and processing the measured results.

2. The method for measuring as set forth in claim 1, said first counting frequency being $f_o/2$ and said second frequency being $f_o$.

3. The method for measuring as set forth in claim 2, said processing comprising accumulating in counting means the sum of the counts responsive to the respective counting frequencies produced during the base line length of said start pulse signal, during the base line length of said stop pulse signal, and during the interval between the end of said start pulse signal and the start of said stop pulse signal.

4. The method for measuring the time interval between two time spaced approximately symmetrical pulse signals of identical or of opposite polarity, one of said signals defining the interval start pulse signal and the other the interval stop pulse signal, comprising the steps of:

applying a respective direct current threshold signal to said pulse signals to define a base line for each of said pulse signals;

measuring with a predetermined counting frequency the time related base line length of the interval start pulse signal and the time related base line length of the interval stop pulse signal;

dividing by a factor of two the counts responsive to said counting frequency obtained during said start pulse signal base line length and said stop pulse signal base line length;

measuring with said predetermined frequency the time related interval between the end of said start pulse signal taken at its base line and the start of the stop pulse signal taken at its base line, and forming the sum of the divided counts responsive to the line length of said start signal and the line length of said stop signal, and adding to said sum the counts responsive to said interval between the end of said start signal and the start of said stop signal.

5. The method for measuring the time interval between two time spaced approximately symmetrical pulse signals of identical or opposite polarity, one of said signals defining the interval start pulse signal and the other defining the interval stop pulse signal, comprising the steps:

applying a respective direct current threshold signal to said pulse signals to define a base line for each of said pulse signals;

measuring with a predetermined counting frequency the time related base line length of the interval start pulse signal and the interval between the end of the interval start pulse signal taken at its respective base line and the start of the interval stop pulse signal taken at its respective base line;

providing a first sum of the counts responsive to said counting frequency produced in response to the base line length of said start pulse signal and said interval between said interval start signal and said interval stop signal;

measuring with said counting frequency the interval between the end of the interval start pulse signal taken at its respective base line and the start of the interval stop pulse signal taken at its respective base line, and the base line length of the interval stop signal;

providing a second sum of the counts responsive to said counting frequency produced in response to said interval between said interval start signal and said interval stop signal and the base line length of said stop signal;

forming a third sum of counts by summing said first sum and said second sum, and dividing the counts forming said third sum by a factor of two.

6. An apparatus for measuring the time related interval between two time spaced approximately symmetrical pulse signals of identical or of opposite polarity comprising:

means for providing respectively a start interval pulse signal and a subsequent stop interval pulse signal;

threshold means coupled for receiving said start signal and said stop signal and defining a base line for each of said signals;

a first counting frequency means and a second counting frequency means;

a counter;

control means coupling said threshold means and said first counting frequency means to said counter for providing to said counter counts responsive to said first counting frequency means during the time span defined by the base line length of said start signal and the base line length of said stop signal, and for coupling said threshold means and said second counting frequency means to said counter for providing counts responsive to said second counting frequency means during the time interval between the end of said start interval signal taken at its base line and the start of said stop interval signal taken at its base line, and said counter causing said counts to be summed.

7. An apparatus as set forth in claim 6, said first counting frequency means operating at a frequency $f_o/2$ and second counting frequency means operating at a frequency $f_o$.

8. An apparatus as set forth in claim 7 and said threshold means including adjusting means for independently setting the base line of said start signal and the base line of said stop signal.

9. An apparatus for measuring the time related interval between two time spaced approximately symmetrical pulse signals of identical or of opposite polarity comprising:

means for providing respectively a start interval pulse signal and a subsequent stop interval pulse signal;

threshold means coupled for receiving said start signal and said stop signal and defining a base line for each of said signals;

counting frequency means;

a first counter;

control means coupling said counting frequency means and said threshold means to said first counter for accumulating in said first counter counts responsive to said counting frequency means during the time span defined by the base line length of said start signal and the base line length of said stop signal;

dividing means coupled to said first counter for receiving said accumulated counts and dividing said counts by a factor of two to provide a first output count;

a second counter;

said control means coupling also said counting frequency means and said threshold means to said second counter for accumulating in said second counter counts responsive to said counting frequency means during the time interval between the end of said start signal taken at its base line and the start of the stop signal taken at its base line, thereby providing a second output count, and summing means coupled for receiving said first output count and said second output count to produce the sum of said output counts.

10. An apparatus as set forth in claim 9 and said threshold means including adjusting means for independently setting the base line of said start signal and the base line of said stop signal.

11. An apparatus for measuring the time related interval between two time spaced approximately symmetrical pulse signals of identical or of opposite polarity comprising:

means for providing respectively a start interval pulse signal and a subsequent stop interval pulse signal;

threshold means coupled for receiving said start signal and said stop signal and defining a base line for each of said signals;

counting frequency means;

a first counter and a second counter;

control means coupling said counting frequency means and said threshold means to said first counter for accumulating in said first counter counts responsive to said counting frequency means during the time span defined by the base line length of said start signal and the interval between the end of said start signal taken at its base line and the start of said stop signal taken at its respective base line;

said control means coupling also said counting frequency means and said threshold means to said second counter for accumulating in said second counter counts responsive to the interval between the end of said start signal taken at its base line and the start of said stop signal taken at its base respective base line and during the time span defined by the base line length of said stop signal;

summing means coupled to said first counter and said second counter for receiving the respective counts and forming the sum thereof, and dividing means coupled for receiving the summed counts and dividing said summed counts by a factor of two.

* * * * *